(12) United States Patent
Gray et al.

(10) Patent No.: US 7,735,042 B2
(45) Date of Patent: Jun. 8, 2010

(54) CONTEXT AWARE SUB-CIRCUIT LAYOUT MODIFICATION

(75) Inventors: Michael S. Gray, Fairfax, VT (US);
Matthew T. Guzowski, Essex Junction, VT (US); Jason D. Hibbeler, Williston, VT (US); Kevin W. McCullen, Essex Junction, VT (US); Robert F. Walker, St. George, VT (US); Xin Yuan, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 11/831,998

(22) Filed: Aug. 1, 2007

(65) Prior Publication Data

US 2009/0037851 A1 Feb. 5, 2009

(51) Int. Cl.
*G06F 17/50* (2006.01)
(52) U.S. Cl. .................................................. 716/10
(58) Field of Classification Search .................. 716/2, 716/5, 8–10, 18–19
See application file for complete search history.

(56) References Cited

U.S. PATENT DOCUMENTS

| 5,526,279 | A | 6/1996 | Dick |
| 5,535,134 | A * | 7/1996 | Cohn et al. ............. 716/8 |
| 6,189,132 | B1 * | 2/2001 | Heng et al. .............. 716/11 |
| 6,904,587 | B2 | 6/2005 | Tsai et al. |
| 7,484,197 | B2 * | 1/2009 | Allen et al. ............. 716/10 |
| 2004/0068712 | A1 * | 4/2004 | Heng et al. .............. 716/21 |
| 2007/0168898 | A1 * | 7/2007 | Gupta et al. ............. 716/9 |
| 2007/0204249 | A1 * | 8/2007 | Hibbeler .................. 716/10 |
| 2007/0240088 | A1 * | 10/2007 | Tang et al. ............... 716/9 |
| 2007/0283301 | A1 * | 12/2007 | Karandikar et al. ...... 716/5 |
| 2008/0313577 | A1 * | 12/2008 | Tang et al. ............... 716/2 |

* cited by examiner

*Primary Examiner*—Stacy A Whitmore
(74) *Attorney, Agent, or Firm*—Ryan K. Simmons; Hoffman Warnick LLC

(57) ABSTRACT

A method, system and program product for context aware sub-circuit layout modification are disclosed. The method may include defining at least one context for the sub-circuit for each circuit that uses the sub-circuit; in the case that a plurality of contexts are defined, minimizing a number of contexts for the sub-circuit by combining contexts into at least one stage; placing each stage into a staged layout; and modifying the sub-circuit by modifying the staged layout.

20 Claims, 6 Drawing Sheets

CONTEXT AWARE SUB-CIRCUIT LAYOUT MODIFICATION

BACKGROUND

1. Technical Field

The disclosure relates generally to integrated circuit (IC) chip fabrication, and more particularly, to context aware sub-circuit layout modification.

2. Background Art

In hierarchical IC chip designs, a set of commonly used sub-circuits, such as library cells, are designed in order to maximize the design re-use and productivity. The sub-circuit layout can be used by many different circuits (macros) and IP blocks of the IC chips. In some customized IC chip designs, there are strict methodology requirements imposed on the placement and routing between the sub-circuits and the environments thereof. For example, application specific IC (ASIC) chip design methodology requires that sub-circuits must be placed in a non-overlapping fashion and design shapes must be half of a ground rule value away from the bounding box of the sub-circuits. However, in other customized designs, there is no such restriction and the interaction between the sub-circuits and their environments can be different from one circuit to another.

A circuit layout may be modified for a number of reasons, for example, to meet the ground rule constraints, to improve the performance, to migrate it from one technology to another, to fix the ground rule violations due to an engineering change order in the design flow, etc. In order to maintain the hierarchy, when a sub-circuit layout is used by multiple macros, the modified layout of the sub-circuit must be identical among all the modified macros. Therefore, usually the sub-circuit is modified first, and then maintained unchanged (frozen) when the macros are modified. Changing the layout of a sub-circuit presents a challenge because it requires the consideration of all the environment of the sub-circuit in order to get the best modified layout. For example, suppose a sub-circuit A is used by three macros M1, M2 and M3. There is no strict design methodology requirement on where and how sub-circuit A must be placed and routed in the macros, i.e., as long as it does not introduce ground rule violation, shapes from the macros can be placed at any spot with respect to sub-circuit A. In order to maintain the hierarchy, when one or more macros of M1, M2 and M3 need to be modified for layout migration from one technology to another, sub-circuit A is modified first and maintained frozen when the macros are modified. If, as shown in FIG. 1, sub-circuit A is modified independently (from A to A' in FIG. 1) without the consideration of its interaction with all of the circuits (e.g., M1 in FIG. 1), then it is possible that some ground rule violations 10 may occur between sub-circuit A and the macros (e.g., M1 in FIG. 1) that cannot be fixed by modifying the macros due to the fact that the content of sub-circuit A is already frozen. Currently, there is no adequate technique to address this situation.

SUMMARY

A method, system and program product for context aware sub-circuit layout modification are disclosed. The method may include defining at least one context for the sub-circuit for each circuit that uses the sub-circuit; in the case that a plurality of contexts are defined, minimizing a number of contexts for the sub-circuit by combining contexts into at least one stage; placing each stage into a staged layout; and modifying the sub-circuit by modifying the staged layout.

A first aspect of the disclosure provides a method of modifying a sub-circuit layout, the sub-circuit used by a plurality of circuits, the method comprising: defining at least one context for the sub-circuit for each circuit that uses the sub-circuit; in the case that a plurality of contexts are defined, minimizing a number of contexts for the sub-circuit by combining contexts into at least one stage; placing each stage into a staged layout; and modifying the sub-circuit by modifying the staged layout.

A second aspect of the disclosure provides a system for modifying a sub-circuit layout, the sub-circuit used by a plurality of circuits, the system comprising: means for defining at least one context for the sub-circuit for each circuit that uses the sub-circuit; means for, in the case that a plurality of contexts are defined, minimizing a number of contexts for the sub-circuit by combining contexts into at least one stage; means for placing each stage into a staged layout; and means for modifying the sub-circuit by modifying the staged layout.

A third aspect of the disclosure provides a program product stored on a computer-readable medium, which when executed, performs sub-circuit layout modification, the program product comprising program code for performing the following: defining at least one context for the sub-circuit for each circuit that uses the sub-circuit; in the case that a plurality of contexts are defined, minimizing a number of contexts for the sub-circuit by combining contexts into at least one stage; placing each stage into a staged layout; and modifying the sub-circuit by modifying the staged layout.

A fourth aspect of the disclosure provides a computer-readable medium that includes computer program code to enable a computer infrastructure to sub-circuit layout modification, the computer-readable medium comprising computer program code for performing the method steps of the disclosure.

A fifth aspect of the disclosure provides a business method for sub-circuit layout modification, the business method comprising managing a computer infrastructure that performs each of the steps of the disclosure; and receiving payment based on the managing step.

A sixth aspect of the disclosure provides a method of generating a system for sub-circuit layout modification, the method comprising: obtaining a computer infrastructure; and deploying means for performing each of the steps of the disclosure to the computer infrastructure.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
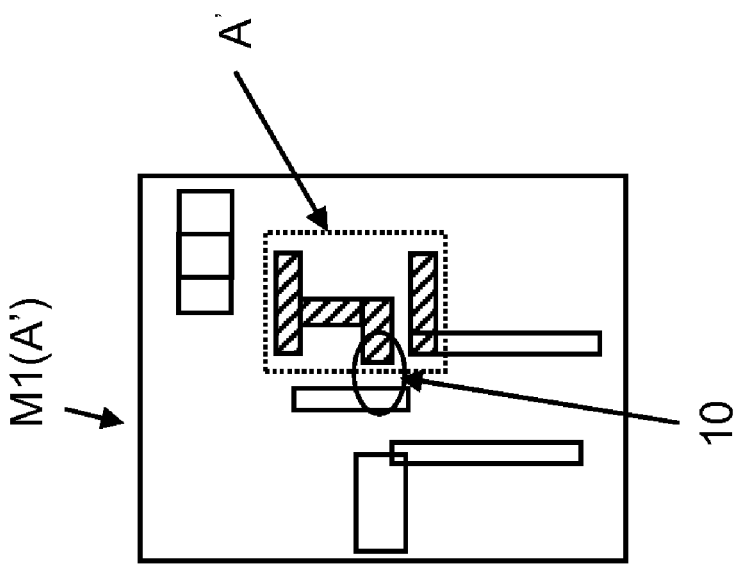
FIG. 1 shows a conventional sub-circuit modification.
Figure 1:
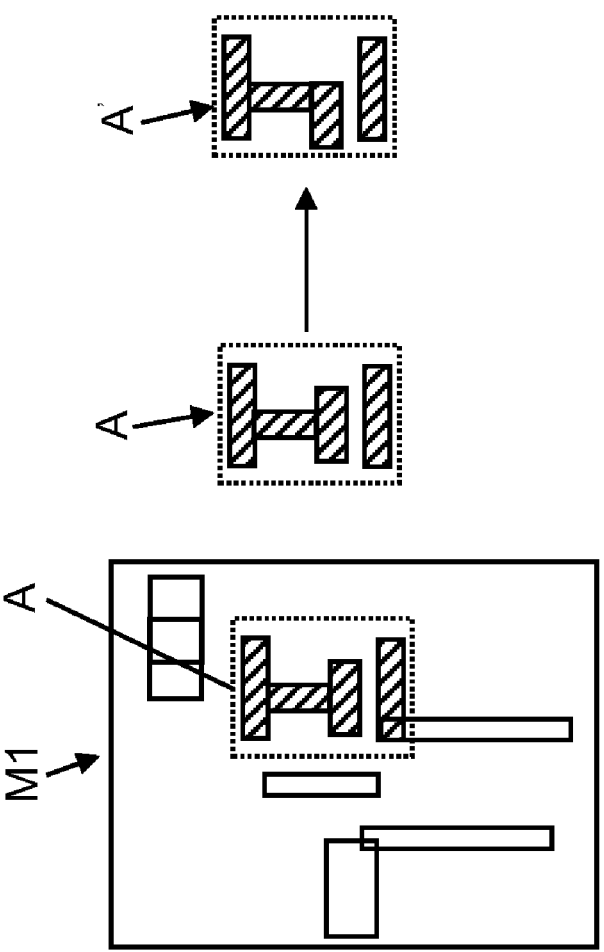
Figure 2:
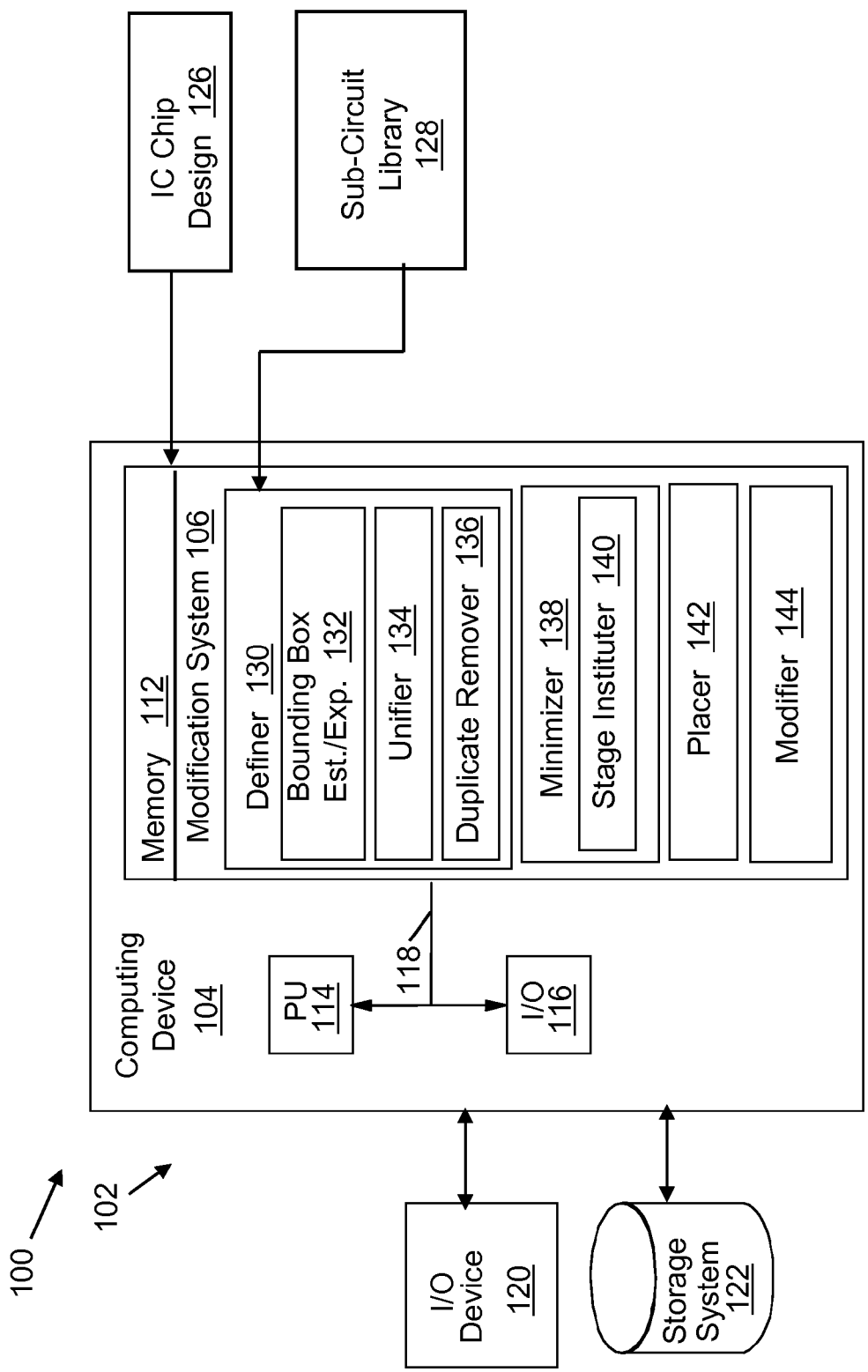
FIG. 2 shows one embodiment of a block diagram of a modification system according to the disclosure.

Turning to the drawings, FIG. 2 shows an illustrative environment 100 for modification of a sub-circuit layout. To this extent, environment 100 includes a computer infrastructure 102 that can perform the various process steps described herein for modifying the sub-circuit. In particular, computer infrastructure 102 is shown including a computing device 104 that comprises a modification system 106, which enables computing device 104 to modify the layout of a sub-circuit by performing the process steps of the disclosure.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as modification system 106, that is stored in memory 112 and/or storage system 122. While executing computer program code, processor 114 can read and/or write data to/from memory 112, storage system 122, and/or I/O interface 116. Bus 118 provides a communications link between each of the components in computing device 104. I/O device 118 can comprise any device that enables a user to interact with computing device 104 or any device that enables computing device 104 to communicate with one or more other computing devices. Input/output devices (including but not limited to keyboards, displays, pointing devices, etc.) can be coupled to the system either directly or through intervening I/O controllers.

In any event, computing device 104 can comprise any general purpose computing article of manufacture capable of executing computer program code installed by a user (e.g., a personal computer, server, handheld device, etc.). However, it is understood that computing device 104 and modification system 106 are only representative of various possible equivalent computing devices that may perform the various process steps of the disclosure. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

Inputs to modification system 106 may include an integrated circuit (IC) chip design 126, i.e., including circuits and sub-circuits. Sub-circuits may be selected from sub-circuit library 128. A "sub-circuit" may include any shape within IC chip design 126 that is stored for repeated use by a plurality of circuits in the IC chip design. The terms "circuit" and "macro" may be used interchangeably herein.

As previously mentioned and discussed further below, modification system 106 enables computing infrastructure 102 to modify the sub-circuit layout. To this extent, modification system 106 is shown including a definer 130 including a bounding box establisher/expander (est./exp.) 132, a unifier 134 and a duplicate remover 136; a minimizer 138 including a stage instituter 140; a placer 142 and a modifier 144. Other functions necessary for the cooperation of the above systems may also be provided, as required. Operation of each of these systems is discussed further below. However, it is understood that some of the various systems shown in FIG. 2 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

Figure 3:
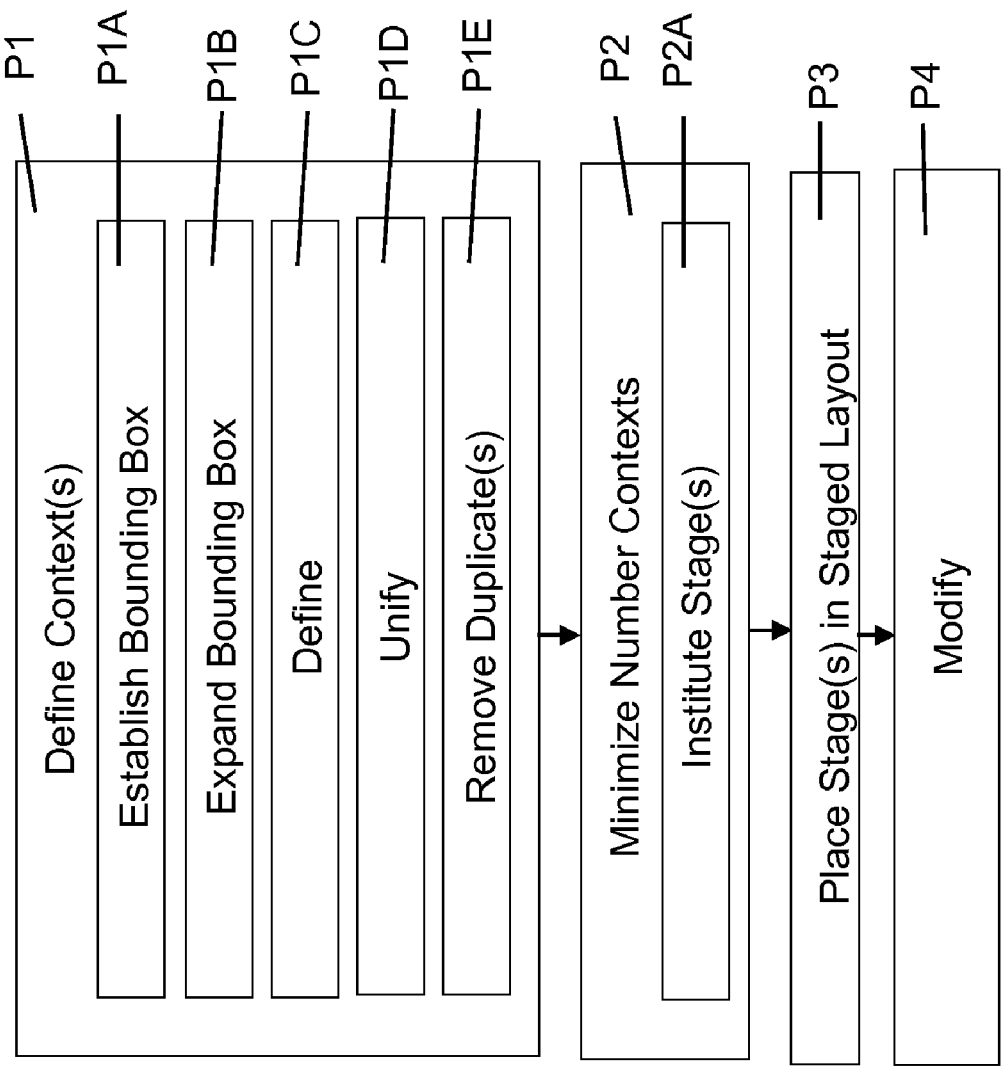
FIG. 3 shows one embodiment of an operational methodology of the system of FIG. 2.
Figure 4:
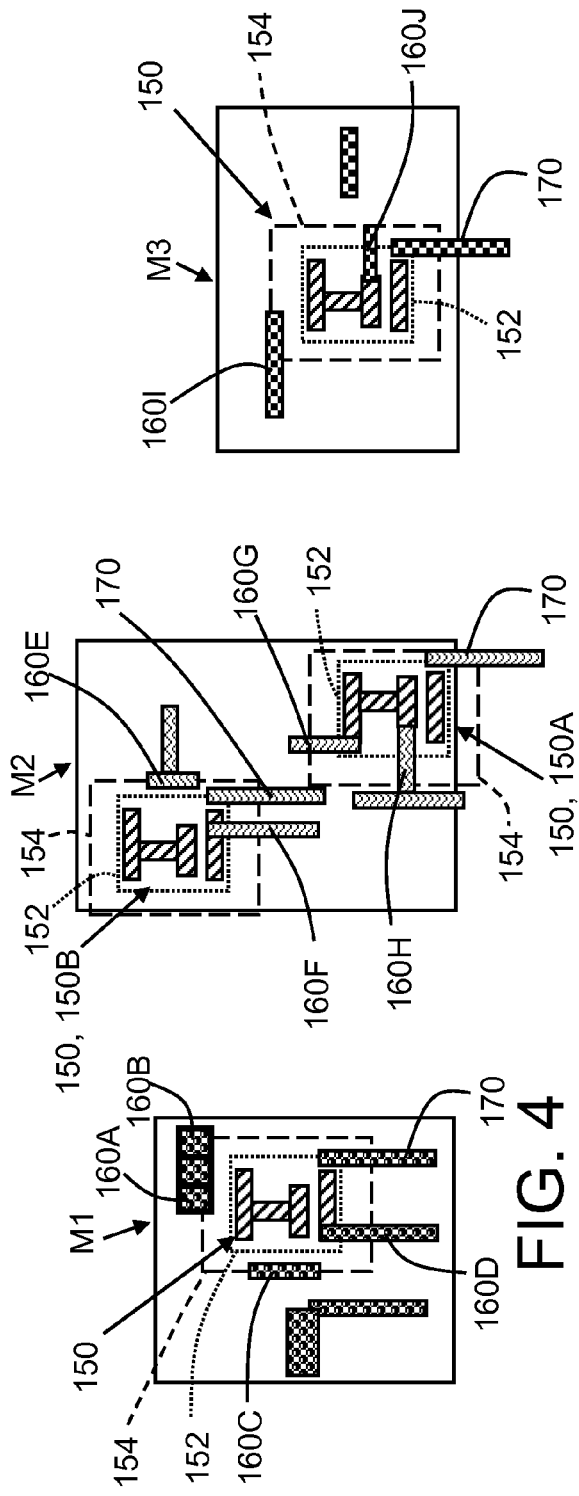
FIGS. 4-7 show processes for the modification of an illustrative sub-circuit that has been used by multiple circuits.

Turning to FIG. 3, one embodiment of an operational methodology of modification system 106 will now be described. FIGS. 4-7 will be used to describe the operational methodology. As an introduction, FIG. 4 shows three illustrative circuits M1, M2 and M3, i.e., macros, each including an illustrative sub-circuit 150. Circuit M2 includes two renditions of sub-circuit 150 with one rendition 150A being a mirror image of rendition 150B, the latter of which is oriented the same as the rendition in the other circuits M1 and M3. As understood, circuits M1, M2 and M3 represent circuitry portions of IC chip design 126 (FIG. 2). It is understood that circuits M1, M2 and M3 and sub-circuit 150 are meant to be illustrative and that the teachings of the disclosure may be applied to a large number of sub-circuits 150 and related circuits. The current disclosure presents a methodology to modify sub-circuit 150 with the awareness of its context to assist the modification of the circuits in order to obtain the best results.

Figure 5:
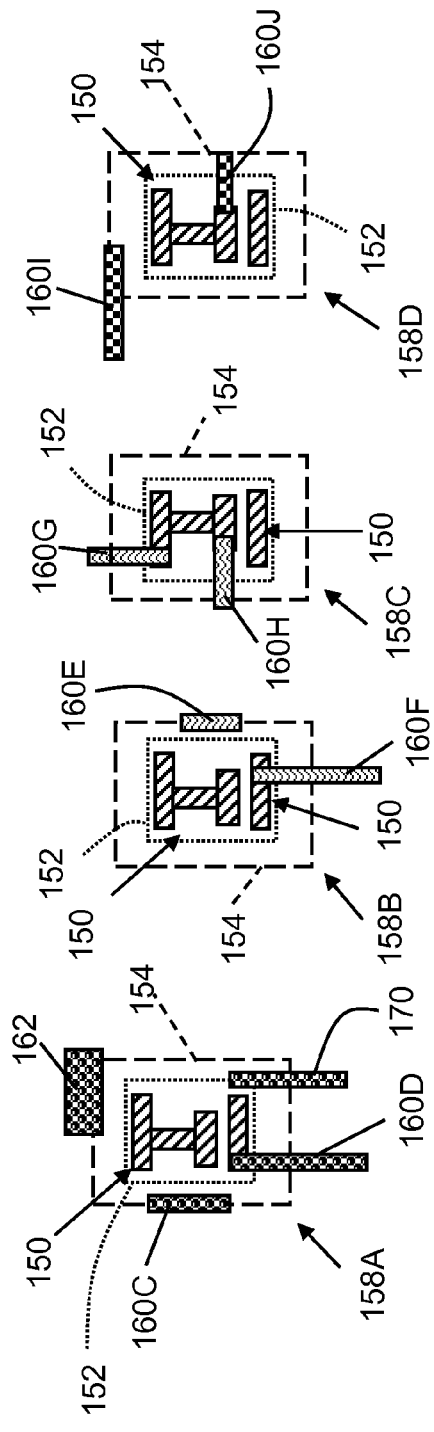

With reference to FIGS. 3 and 4-7, in a first process P1, definer 130 defines at least one context for the sub-circuit for each circuit that uses the sub-circuit. As used herein, "context" refers to the set of circumstances or facts (e.g., shapes) that surround a particular sub-circuit 150 as it is positioned within a circuit, e.g., M1-M3. Process P1 may occur in a number of ways. In one embodiment, in process P1A, bounding box establisher/expander (est./exp.) 132 establishes a bounding box 152 about sub-circuit 150. Bounding box 152 may be user selected, but in any event encloses all of the shapes that constitute sub-circuit 150. In process P1B, bounding box establisher/expander (est./exp.) 132 expands bounding box 152 by a region of interest (ROI) to a size shown by expanded bounding box 154. The ROI may be any value a user may specify relative to sub-circuit 150. In one embodiment, however, the ROI is a maximum ground rule value, e.g., for IC chip design 126 (FIG. 2). As shown in FIG. 5, in process P1C, definer 130 defines a context 158A-D based on expanded bounding box 154 as including sub-circuit 150 and any intrusion shape 160 that intrudes (crosses) into expanded bounding box 154 therefor. Each rendition of sub-circuit 150, hence, results in a context 158A-D that includes any shape that interacts with sub-circuit 150 within a tolerance based on the ROI, e.g., a maximum ground rule value.

In processes P1D and P1E, processes to minimize the computational resources required may be optionally implemented. In process P1D, unifier 134 unifies overlapping shapes within each context 158A-D. For example, as highlighted in FIG. 4, two shapes 160A, 160B overlap. These shapes are unified into a single shape 162 in context 158A in FIG. 5. In process P1E, duplicate remover 136 maintains only one copy of any duplicate shapes appearing in each context 158A-D not part of sub-circuit 150, i.e., it removes the others. For example, as shown in FIG. 4, shape 170 would appear in each context 158A-D, but its duplicates are removed from contexts 158B-D as shown in FIG. 5 with one copy maintained in context 158A.

Figure 6:
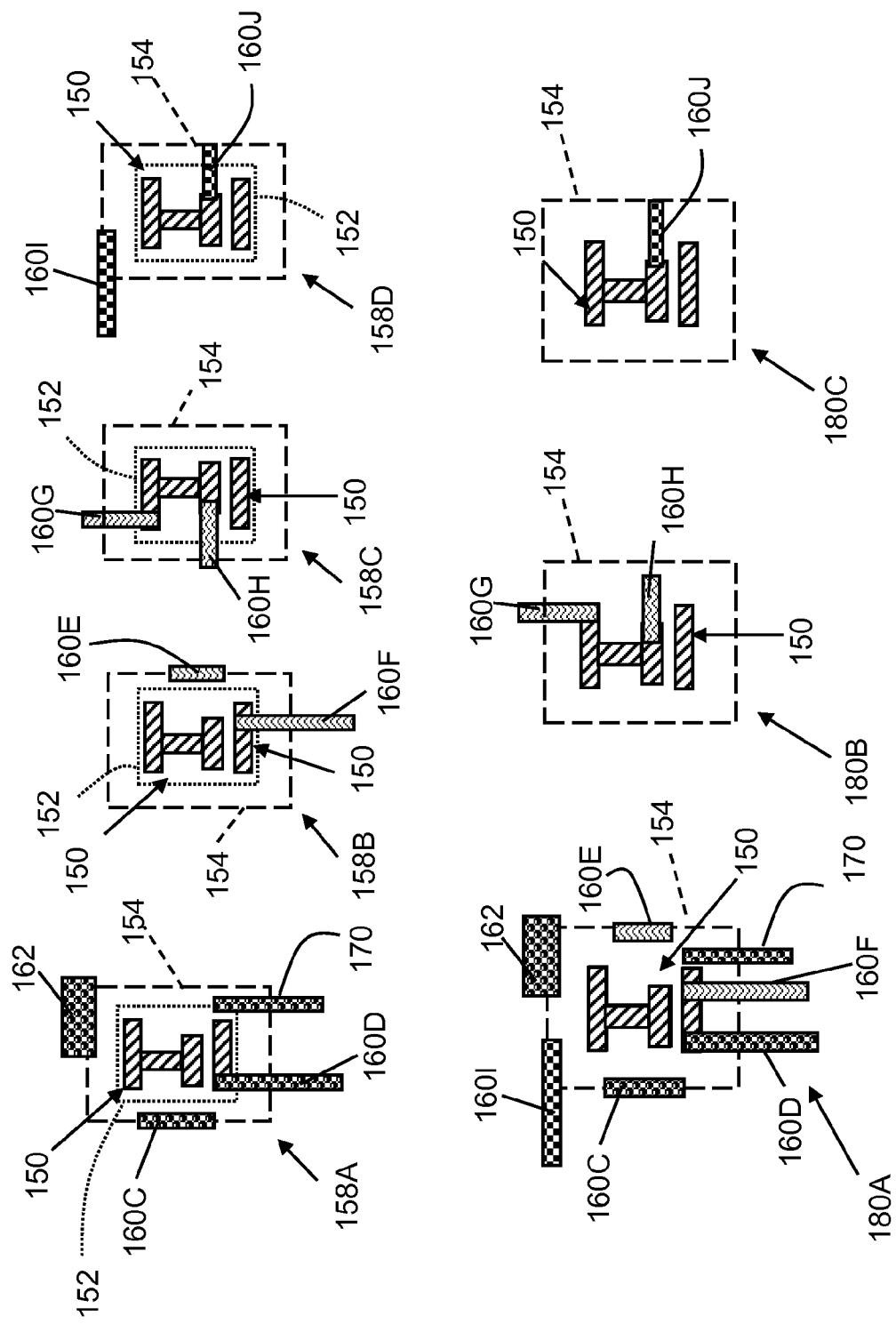

In process P2, as shown in FIG. 6, where a plurality of contexts 158A-D are defined, minimizer 138 minimizes a number of contexts 158A-D for sub-circuit 150 by combining contexts into at least one stage 180A-C. Minimizer 136 institutes as few stages 180A-C as possible. In one embodiment, process P2A includes stage instituter 140 instituting a stage, e.g., 158A, by including in the stage any intrusion shapes 160 from the plurality of contexts 158A-D that do not interfere with another intrusion shape. Process P2A is repeated as necessary, e.g., to institute stages 180B-C, for intrusion shapes 160C-J, 162 from contexts 158A-D that interfere with at least one other intrusion shape 160C-J, 162. In the examples shown, stage 180A includes combined shape 162, shapes 160C, 160D and 170 from context 158A, shapes 160E and 160F from context 158B, and shape 160I from context 158D; stage 180B includes shapes 160G and 160H from context 158C (shown reversed as a correction to the mirror position of sub-circuit 150A (FIG. 4)); and stage 180C includes shape 160J from context 158D.

Figure 7:
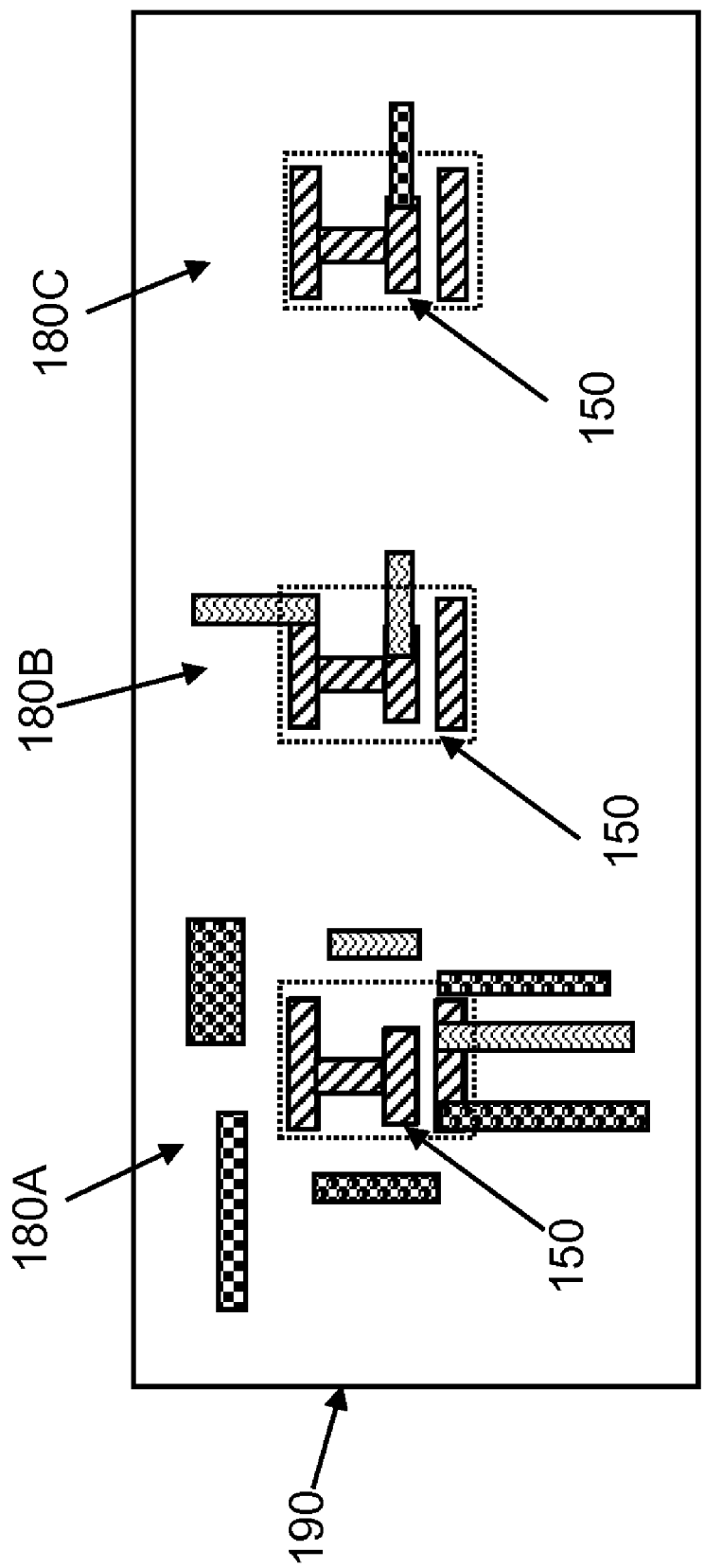

In process P3, as shown in FIG. 7, placer 142 places each stage 180A-C into a staged layout 190, i.e., such that there is enough space between each stage 180A-C for the following modification. Stage layout 190 has three instances of sub-circuit 150 and the intrusion shapes from the extracted contexts are treated as native shapes of staged layout 190.

In process P4, modifier 144 modifies sub-circuit 150 by modifying staged layout 190. This process may be performed using any now known or later developed constraint-based layout optimization technique, e.g., a minimum layout perturbation legalization technique. When modifying staged layout 190, in addition to modifying sub-circuit 150, the intrusion shapes from the extracted contexts can be treated as either blockage, i.e., frozen objects, or allowed to be modified but with less freedom.

As discussed herein, various systems and components may be described as "obtaining" data (e.g., sub-circuit 150, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

While shown and described herein as a method and system for modifying the sub-circuit, it is understood that the disclosure further provides various alternative embodiments. That is, the disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable or computer-readable medium providing program code for use by or in connection with a computer or any instruction execution system, which when executed, enables a computer infrastructure to modify the sub-circuit layout. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, such as memory 122, magnetic tape, a removable computer diskette, a random access memory (RAM), a read-only memory (ROM), a tape, a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processing unit 114 coupled directly or indirectly to memory elements through a system bus 118. The memory elements can include local memory, e.g., memory 112, employed during actual execution of the program code, bulk storage (e.g., memory system 122), and cache memories which provide temporary storage of at least some program code in order to reduce the number of times code must be retrieved from bulk storage during execution.

In another embodiment, the disclosure provides a method of generating a system for modifying the sub-circuit. In this case, a computer infrastructure, such as computer infrastructure 102 (FIG. 2), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 (FIG. 2), from a computer-readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as an application service provider, could offer to modify the sub-circuit layout as described herein. In this case, the service provider can manage (e.g., create, maintain, support, etc.) a computer infrastructure, such as computer infrastructure 102 (FIG. 2), that performs the process described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method of modifying a sub-circuit layout performed using at least one computing device, the sub-circuit used by a plurality of circuits, the method comprising:
    defining, using the at least one computing device, at least one context for the sub-circuit for each circuit that uses the sub-circuit;
    in the case that a plurality of contexts are defined, minimizing, using the at least one computing device, a number of contexts for the sub-circuit by combining contexts into at least one stage;
    placing, using the at least one computing device, each stage into a staged layout; and
    modifying, using the at least one computing device, the sub-circuit by modifying the staged layout.

2. The method of claim 1, wherein the defining includes:
    establishing a bounding box about the sub-circuit;
    expanding the bounding box by a region of interest (ROI); and
    defining a context as including the sub-circuit and any intrusion shape that intrudes into the expanded bounding box.

3. The method of claim 2, wherein the ROI is a maximum ground rule value.

4. The method of claim 2, wherein the minimizing includes instituting as few stages as possible by:
    instituting a stage by including in the stage any intrusion shapes from the plurality of contexts that do not interfere with another intrusion shape; and
    repeating the instituting as necessary for intrusion shapes from the plurality of contexts that interfere with at least one other intrusion shape.

5. The method of claim 1, wherein the defining further includes:
    unifying overlapping shapes within each context; and
    maintaining only one copy of any duplicate shapes appearing in each context.

6. The method of claim 1, wherein the modifying includes using a constraint-based layout optimization technique.

7. The method of claim 6, wherein the constraint-based layout optimization technique includes a minimum layout perturbation legalization technique.

8. A system for modifying a sub-circuit, the sub-circuit used by a plurality of circuits, the system comprising:
    means for defining at least one context for the sub-circuit for each circuit that uses the sub-circuit;
    means for, in the case that a plurality of contexts are defined, minimizing a number of contexts for the sub-circuit by combining contexts into at least one stage;
    means for placing each stage into a staged layout; and
    means for modifying the sub-circuit by modifying the staged layout.

9. The system of claim 8, wherein the defining means includes:
    means for establishing a bounding box about the sub-circuit;
    means for expanding the bounding box by a region of interest (ROI); and
    means for defining a context as including the sub-circuit and any intrusion shape that intrudes into the expanded bounding box.

10. The system of claim 9, wherein the ROI is a maximum ground rule value.

11. The system of claim 9, wherein the minimizing means includes means for instituting as few stages as possible by:
    instituting a stage by including in the stage any intrusion shapes from the plurality of contexts that do not interfere with another intrusion shape; and
    repeating the instituting as necessary for intrusion shapes from the plurality of contexts that interfere with at least one other intrusion shape.

12. The system of claim 8, wherein the defining means further includes:
    means for unifying overlapping shapes within each context; and
    means for maintaining only one copy of any duplicate shapes appearing in each context.

13. The system of claim 8, wherein the modifying means using a constraint-based layout optimization technique.

14. The system of claim 13, wherein the constraint-based layout optimization technique includes a minimum layout perturbation legalization technique.

15. A program product stored on a computer-readable medium, which when executed, performs sub-circuit modification, the program product comprising program code for performing the following:
    defining at least one context for the sub-circuit for each circuit that uses the sub-circuit;
    in the case that a plurality of contexts are defined, minimizing a number of contexts for the sub-circuit by combining contexts into at least one stage;
    placing each stage into a staged layout; and
    modifying the sub-circuit by modifying the staged layout.

16. The program product of claim 15, wherein the defining includes:
    establishing a bounding box about the sub-circuit;
    expanding the bounding box by a region of interest (ROI); and
    defining a context as including the sub-circuit and any intrusion shape that intrudes into the expanded bounding box.

17. The program product of claim 16, wherein the ROI is a maximum ground rule value.

18. The program product of claim 16, wherein the minimizing includes instituting as few stages as possible by:
    instituting a stage by including in the stage any intrusion shapes from the plurality of contexts that do not interfere with another intrusion shape; and
    repeating the instituting as necessary for intrusion shapes from the plurality of contexts that interfere with at least one other intrusion shape.

19. The program product of claim 15, wherein the defining further includes:
    unifying overlapping shapes within each context; and
    maintaining only one copy of any duplicate shapes appearing in each context.

20. The program product of claim 15, wherein the modifying includes using a constraint-based layout optimization technique.

* * * * *